(12) United States Patent
Ushijima (10) Patent No.: US 11,984,383 B2
(45) Date of Patent: May 14, 2024

(54) SEMICONDUCTOR DEVICE

(71) Applicant: Mitsubishi Electric Corporation, Tokyo (JP)

(72) Inventor: Koichi Ushijima, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 442 days.

(21) Appl. No.: 17/436,954

(22) PCT Filed: May 30, 2019

(86) PCT No.: PCT/JP2019/021548
§ 371 (c)(1),
(2) Date: Sep. 7, 2021

(87) PCT Pub. No.: WO2020/240777
PCT Pub. Date: Dec. 3, 2020

(65) Prior Publication Data
US 2022/0173012 A1 Jun. 2, 2022

(51) Int. Cl.
*H01L 23/473* (2006.01)
*H01L 23/367* (2006.01)

(52) U.S. Cl.
CPC ........ *H01L 23/473* (2013.01); *H01L 23/3677* (2013.01)

(58) Field of Classification Search
CPC .............. H01L 23/473; H01L 23/3677; H01L 23/4006; H01L 25/07; H01L 25/18; H05K 7/20
See application file for complete search history.

(56) References Cited

U.S. PATENT DOCUMENTS

| | | | | |
|---|---|---|---|---|
| 5,978,220 | A * | 11/1999 | Frey | F28F 3/12 361/677 |
| 9,237,676 | B2 * | 1/2016 | Gohara | H05K 7/20254 |
| 9,472,488 | B2 * | 10/2016 | Gohara | F28F 3/00 |
| 10,014,236 | B2 * | 7/2018 | Adachi | H01L 23/3675 |
| 11,134,590 | B2 * | 9/2021 | Wang | H05K 7/20927 |

(Continued)

FOREIGN PATENT DOCUMENTS

| JP | 2007-266224 A | 10/2007 |
|---|---|---|
| JP | 2007-281163 A | 10/2007 |
| JP | 2013-013255 A | 1/2013 |

OTHER PUBLICATIONS

International Search Report issued in PCT/JP2019/021548; dated Jul. 30, 2019.

*Primary Examiner* — Jarrett J Stark
(74) *Attorney, Agent, or Firm* — Studebaker & Brackett PC (57) ABSTRACT

The plurality of first active elements, the plurality of second active elements, and the passive element are disposed in a first range, a second range, and a third range in the first direction, respectively. The third range is between the first range and the second range. Pin fins are accommodated in an opening of a cooling jacket. The opening has a first outlet and a second outlet at a downstream end in a second direction. The first outlet and the second outlet are disposed in the first range and the second range, respectively. The cooling jacket has a flow dividing wall at a downstream end in the second direction. The flow dividing wall is disposed in the third range. The cooling jacket has a refrigerant introduction groove on a bottom surface.

4 Claims, 5 Drawing Sheets

(56) References Cited

U.S. PATENT DOCUMENTS

| | | | | |
|---|---|---|---|---|
| 11,284,534 B2* | 3/2022 | Yamaguchi | ......... | H05K 7/20272 |
| 2008/0237847 A1* | 10/2008 | Nakanishi | ................. | F28F 3/12 |
| | | | | 257/722 |
| 2009/0065178 A1* | 3/2009 | Kasezawa | ............. | H01L 23/473 |
| | | | | 165/104.19 |
| 2009/0090490 A1 | 4/2009 | Yoshida et al. | | |
| 2010/0002397 A1* | 1/2010 | Toh | ....................... | H01L 23/473 |
| | | | | 361/713 |
| 2010/0172091 A1* | 7/2010 | Nishiura | ............... | H01L 23/473 |
| | | | | 361/689 |
| 2011/0267781 A1* | 11/2011 | Takayanagi | ............. | H01L 23/36 |
| | | | | 361/720 |
| 2012/0139096 A1* | 6/2012 | Gohara | ............... | H01L 23/3735 |
| | | | | 257/E23.101 |
| 2012/0279761 A1* | 11/2012 | Hori | .................... | H01L 23/3735 |
| | | | | 228/122.1 |
| 2013/0119525 A1* | 5/2013 | Tsuyuno | ................. | H01L 24/37 |
| | | | | 438/122 |
| 2013/0135824 A1* | 5/2013 | Harubeppu | ............. | H01L 23/42 |
| | | | | 361/709 |
| 2014/0043765 A1* | 2/2014 | Gohara | ................. | H01L 23/473 |
| | | | | 361/699 |
| 2015/0380338 A1* | 12/2015 | Hori | ....................... | H01L 25/073 |
| | | | | 257/693 |
| 2016/0079155 A1* | 3/2016 | Kawase | ................ | H01L 25/072 |
| | | | | 257/712 |
| 2016/0104654 A1* | 4/2016 | Ushijima | ............ | H01L 23/4006 |
| | | | | 257/718 |
| 2016/0129792 A1* | 5/2016 | Gohara | .................... | B60K 1/00 |
| | | | | 29/890.035 |
| 2016/0190038 A1* | 6/2016 | Koyama | ............ | H05K 7/20927 |
| | | | | 165/80.4 |
| 2017/0271240 A1* | 9/2017 | Inoue | .................... | H01L 23/473 |
| 2019/0098777 A1* | 3/2019 | Nakatsu | ................ | H02M 1/327 |
| 2020/0344905 A1* | 10/2020 | Prajuckamol | ...... | H05K 7/20154 |

* cited by examiner

SEMICONDUCTOR DEVICE

TECHNICAL FIELD

The present invention relates to a semiconductor device.

BACKGROUND ART

A water-cooled power module includes a plurality of semiconductor elements and a cooler. Refrigerant flows through the cooler. The plurality of semiconductor elements are cooled by the refrigerant flowing through the cooler.

In a water-cooled power module, various cooler structures have been proposed in order to effectively cool a plurality of semiconductor elements.

For example, in the technique described in Patent Document 1, a baffle plate that prevents refrigerant from flowing around a heat radiating fin group is provided (paragraph 0070). This can improve cooling performance of a power module (paragraph 0070).

Further, in the technique described in Patent Document 2, a water-cooling jacket is deformed at a convex portion of a central portion of a circuit board (paragraph 0039). As a result, a flow path in a portion of the water-cooling jacket corresponding to the central portion of the circuit board is narrowed, and a flow velocity in the portion is increased accordingly (paragraph 0039). This can improve heat release of a power module (paragraph 0039).

PRIOR ART DOCUMENTS

Patent Documents

Patent Document 1: Japanese Patent Application Laid-Open No. 2013-13255
Patent Document 2: Japanese Patent Application Laid-Open No. 2007-266224

SUMMARY

Problem to be Solved by the Invention

However, in the conventional water-cooled power modules, refrigerant that has reached a high temperature after being used for cooling a semiconductor element disposed on an upstream side of flow of the refrigerant is used for cooling a semiconductor element disposed on a downstream side of the flow of the refrigerant. Accordingly, the temperature of the latter semiconductor element becomes higher than the temperature of the former semiconductor element. This causes variations in lifetime among the plurality of semiconductor elements. This problem is particularly remarkable in a case where high-load energization is performed.

The present invention was accomplished in view of these problems. An object of the present invention is to uniformly cool a plurality of active elements included in a semiconductor device.

Means to Solve the Problem

A semiconductor device includes a base plate equipped with pin fins, a plurality of first active elements, a plurality of second active elements, a passive element, and a cooling jacket.

A base plate equipped with pin fins includes a base plate and pin fins. The base plate has a first main surface and a second main surface. The second main surface is on a side opposite to a side on which the first main surface is located.

The plurality of first active elements, the plurality of second active elements, and the passive element are disposed on the first main surface. The pin fins are coupled to the second main surface.

The first direction and the second direction are parallel to the first main surface. The second direction is perpendicular to the first direction.

The plurality of first active elements, the plurality of second active elements, and the passive element are disposed in a first range, a second range, and a third range in the first direction, respectively. The third range is between the first range and the second range. The plurality of first active elements are aligned in the second direction. The plurality of second active elements are aligned in the second direction.

The cooling jacket has an opening. The pin fins are accommodated in the opening.

In a first aspect of the present invention, the opening has a first outlet and a second outlet at a downstream end in the second direction. The first outlet and the second outlet are disposed in the first range and the second range, respectively. The cooling jacket also has a flow dividing wall at a downstream end in the second direction. The flow dividing wall is disposed in the third range and disposed between the first outlet and the second outlet.

In a second aspect of the present invention, the opening has an inlet at an upstream end in the second direction. Furthermore, the cooling jacket has a bottom surface. The bottom surface faces the second main surface with the opening interposed therebetween. The cooling jacket has a refrigerant introduction groove on a bottom surface. The refrigerant introduction groove is disposed in the third range and extends from an upstream end in the second direction to the middle of an arrangement range of the plurality of first active elements and the plurality of second active elements in the second direction.

Effects of the Invention

According to the first aspect of the present invention, refrigerant flows flowing through a downstream portion of the opening in the second direction and exiting the opening are formed in the first range and the second range in the first direction, and are not formed in the third range in the first direction. This increases flow velocities of the refrigerant flows flowing through the downstream portion of the opening in the second direction. As a result, active elements disposed on the downstream side in the second direction can be effectively cooled. Therefore, the plurality of active elements included in the semiconductor device can be uniformly cooled.

According to the second aspect of the present invention, refrigerant flows formed by a refrigerant flow flowing through the refrigerant introduction groove and remaining at a low temperature are merged to form the refrigerant flows flowing through the downstream portion of the opening and exiting the opening. As a result, active elements disposed on the downstream side in the second direction can be effectively cooled. Therefore, the plurality of active elements included in the semiconductor device can be uniformly cooled.

Objects, features, aspects, and advantages of the present invention will become more apparent from the following detailed description and the accompanying drawings.

DESCRIPTION OF EMBODIMENT

1 Embodiment 1

1.1 Semiconductor Device

Figure 1:
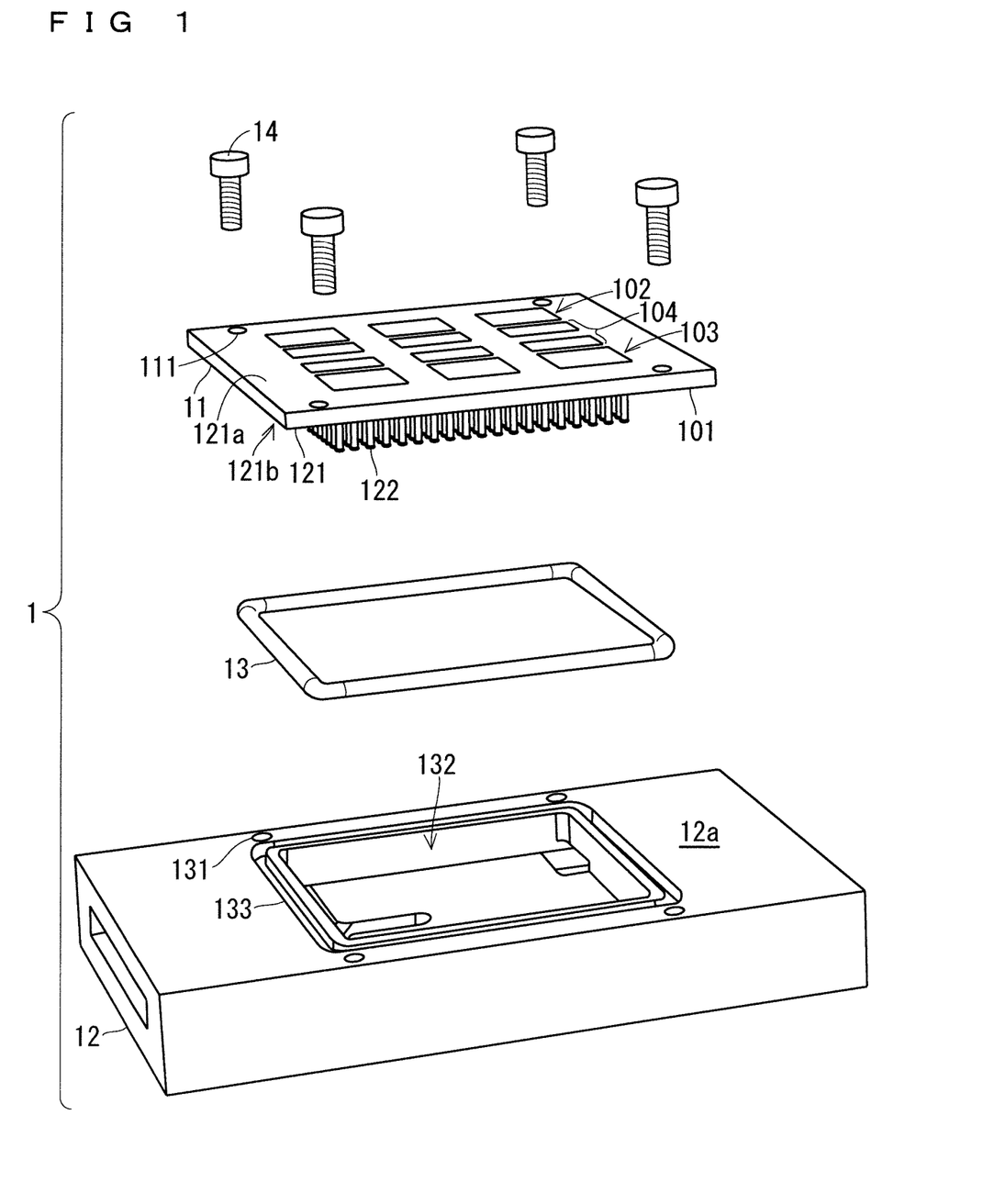
FIG. 1 is an exploded perspective view schematically illustrating a semiconductor device according to Embodiment 1.

FIG. 1 is an exploded perspective view schematically illustrating a semiconductor device according to Embodiment 1.

A semiconductor device 1 according to Embodiment 1 illustrated in FIG. 1 is a semiconductor module equipped with a cooling jacket.

The semiconductor device 1 includes a semiconductor module 11, a cooling jacket 12, an O-ring 13, and a screw 14.

The semiconductor module 11 includes a base plate 101 equipped with pin fins, a plurality of first active elements 102, a plurality of second active elements 103, and a plurality of passive elements 104. Furthermore, the semiconductor module 11 has a mounting screw hole 111. The base plate 101 equipped with pin fins includes a base plate 121 and pin fins 122. The plurality of first active elements 102, the plurality of second active elements 103, and the plurality of passive elements 104 are disposed on a first main surface 121a of the base plate 121. The pin fins 122 are coupled to a second main surface 121b of the base plate 121. The second main surface 121b is on a side opposite to a side on which the first main surface 121a is located.

The cooling jacket 12 includes a mounting screw hole 131, an opening 132, and an O-ring groove 133. The mounting screw hole 131, the opening 132, and the O-ring groove 133 are disposed on a mount surface 12a of the cooling jacket 12. A screw groove is provided in an inner surface of the mounting screw hole 131. The O-ring groove 133 is disposed along an outer periphery of the opening 132. Refrigerant flows through the opening 132.

The O-ring 13 is accommodated in the O-ring groove 133. The screw 14 passes through the mounting screw hole 111 and is screwed into the mounting screw hole 131. Thus, the semiconductor module 11 is attached to the mount surface 12a of the cooling jacket 12 with the O-ring 13 interposed therebetween. The O-ring 13 closes a path passing from the opening 132 to an outside of the semiconductor device 1 through a gap between the semiconductor module 11 and the cooling jacket 12. This seals the refrigerant flowing in the opening 132.

In a state where the semiconductor module 11 is attached to the mount surface 12a of the cooling jacket 12, the pin fins 122 are accommodated in the opening 132. As a result, the pin fins 122 are immersed in the refrigerant flowing in the opening 132. As a result, heat generated by the plurality of first active elements 102, the plurality of second active elements 103, and the plurality of passive elements 104 is transferred to the refrigerant flowing in the opening 132 through the base plate 121 and the pin fins 122 sequentially. The transferred heat is carried to the outside of the semiconductor device 1 by a refrigerant flow exiting from the opening 132. In this way, the plurality of first active elements 102, the plurality of second active elements 103, and the plurality of passive elements 104 are cooled by the refrigerant.

1.2 Semiconductor Module

Figure 2:
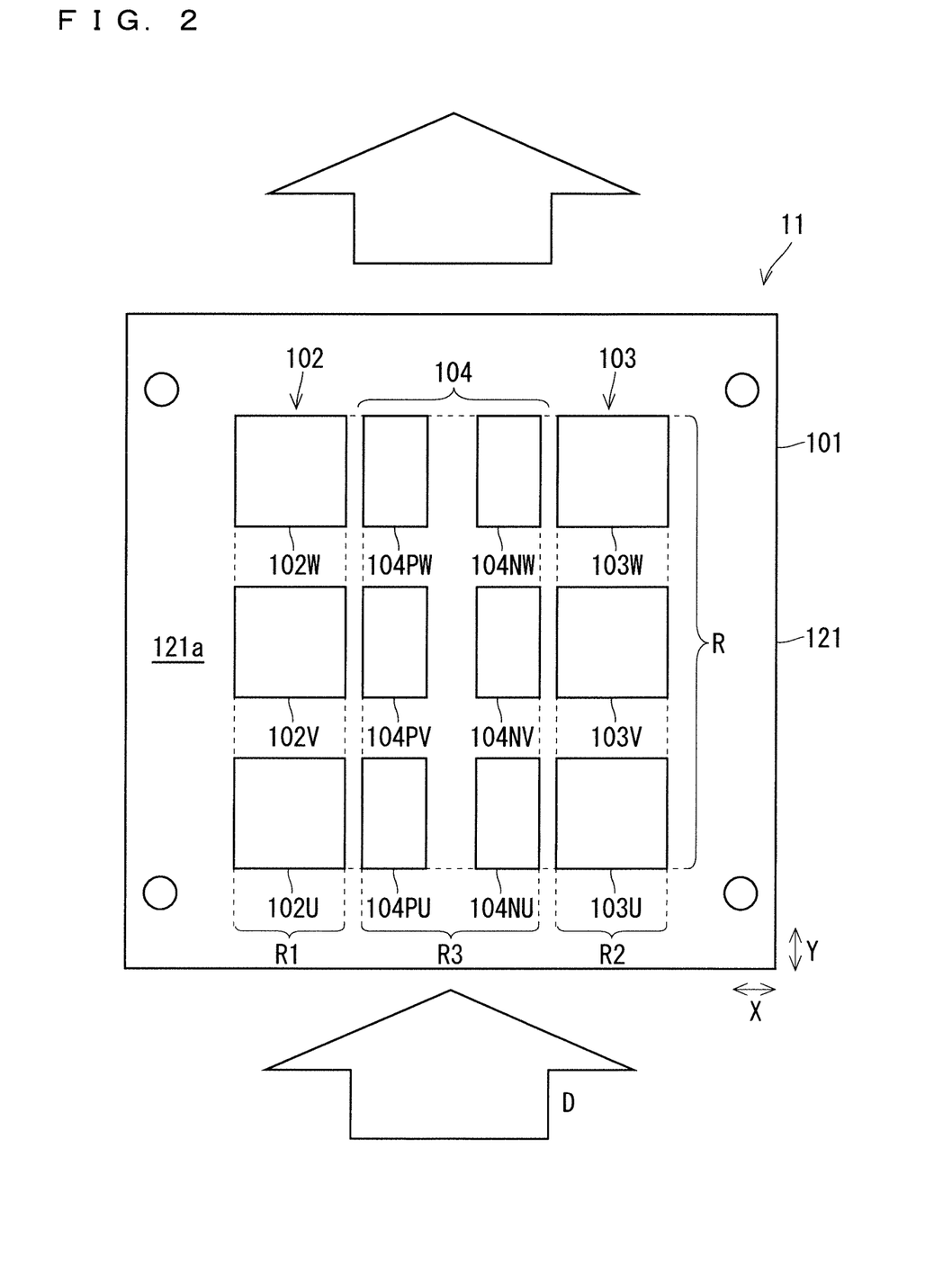
FIG. 2 is a top view schematically illustrating a semiconductor module included in the semiconductor device according to Embodiment 1.

FIG. 2 is a top view schematically illustrating a semiconductor module included in the semiconductor device according to Embodiment 1.

The semiconductor module 11 illustrated in FIG. 2 is a 6-in-1 semiconductor module. Accordingly, an active element group including the plurality of first active elements 102 and the plurality of second active elements 103 includes six semiconductor elements for switching. The semiconductor module 11 may be a semiconductor module other than the 6-in-1 semiconductor module. The semiconductor module 11 is mounted on a power conversion apparatus. The power conversion apparatus is, for example, an inverter. The semiconductor module 11 may be mounted on an apparatus other than the power conversion apparatus.

The plurality of first active elements 102, the plurality of second active elements 103, and the plurality of passive elements 104 are joined to the first main surface 121a of the base plate 121. A joining longitudinal structure for joining the plurality of first active elements 102, the plurality of second active elements 103, and the plurality of passive elements 104 to the first main surface 121a of the base plate 121 is not limited.

The plurality of first active elements 102 include active elements 102U, 102V and 102W. The plurality of second active elements 103 include active elements 103U, 103V, and 103W. The plurality of passive elements 104 include passive elements 104PU, 104PV, 104PW, 104NU, 104NV, and 104NW.

The active elements 102U, 102V, and 102W are switching elements on upper arm sides of a U phase, a V phase, and a W phase, respectively. The active elements 103U, 103V, and 103W are switching elements on lower arm sides of the U phase, the V phase, and the W phase, respectively. The switching elements are insulated gate bipolar transistors (IGBTs). The switching elements may be switching elements other than the IGBTs. For example, the switching elements may be metal-oxide-semiconductor field-effect transistors (MOSFETs). The passive elements 104PU, 104PV, and 104PW are free wheel diodes on the upper arm sides of the U phase, the V phase, and the W phase, respectively. The passive elements 104NU, 104NV, and 104NW are free wheel diodes on the lower arm sides of the U phase, the V phase, and the W phase, respectively.

The plurality of passive elements 104 are disposed in a central portion of the first main surface 121a. The plurality of first active elements 102 and the plurality of second active elements 103 are disposed in a peripheral portion of the first main surface 121a. Accordingly, the plurality of first active elements 102 are disposed in a first range R1 in a first direction X that is parallel to the first main surface 121a of the base plate 121. The plurality of second active elements 103 are disposed in a second range R2 in the first direction X. The plurality of passive elements 104 are disposed in a third range R3 in the first direction X between the first range R1 and the second range R2.

The active elements 102U, 102V, and 102W constituting the plurality of first active elements 102 are linearly aligned in a second direction Y that is parallel to the first main surface 121a of the base plate 121 and perpendicular to the first direction X. The active elements 103U, 103V, and 103W constituting the plurality of second active elements 103 are linearly aligned in the second direction Y. The passive elements 104PU, 104PV, and 104PW constituting the plurality of passive elements 104 are linearly aligned in the second direction Y. The passive elements 104NU, 104NV, and 104NW constituting the plurality of passive elements 104 are linearly aligned in the second direction Y.

The U-phase active element 102U, active element 103U, passive element 104PU, and passive element 104NU are linearly aligned in the first direction X. The V-phase active element 102V, active element 103V, passive element 104PV, and passive element 104NV are linearly aligned in the first direction X. The W-phase active element 102W, active element 103W, passive element 104PW, and passive element 104NW are linearly aligned in the first direction X.

The refrigerant that cools the plurality of first active elements 102, the plurality of second active elements 103, and the plurality of passive elements 104 flows in a refrigerant flow direction D from a position where the U-phase active element 102U, active element 103U, passive element 104PU, and passive element 104NU are disposed to a position where the W-phase active element 102W, active element 103W, passive element 104PW, and passive element 104NW are disposed via a position where the V-phase active element 102V, active element 103V, passive element 104PV, and passive element 104NV are disposed.

1.3 Cooling Jacket

Figure 3:
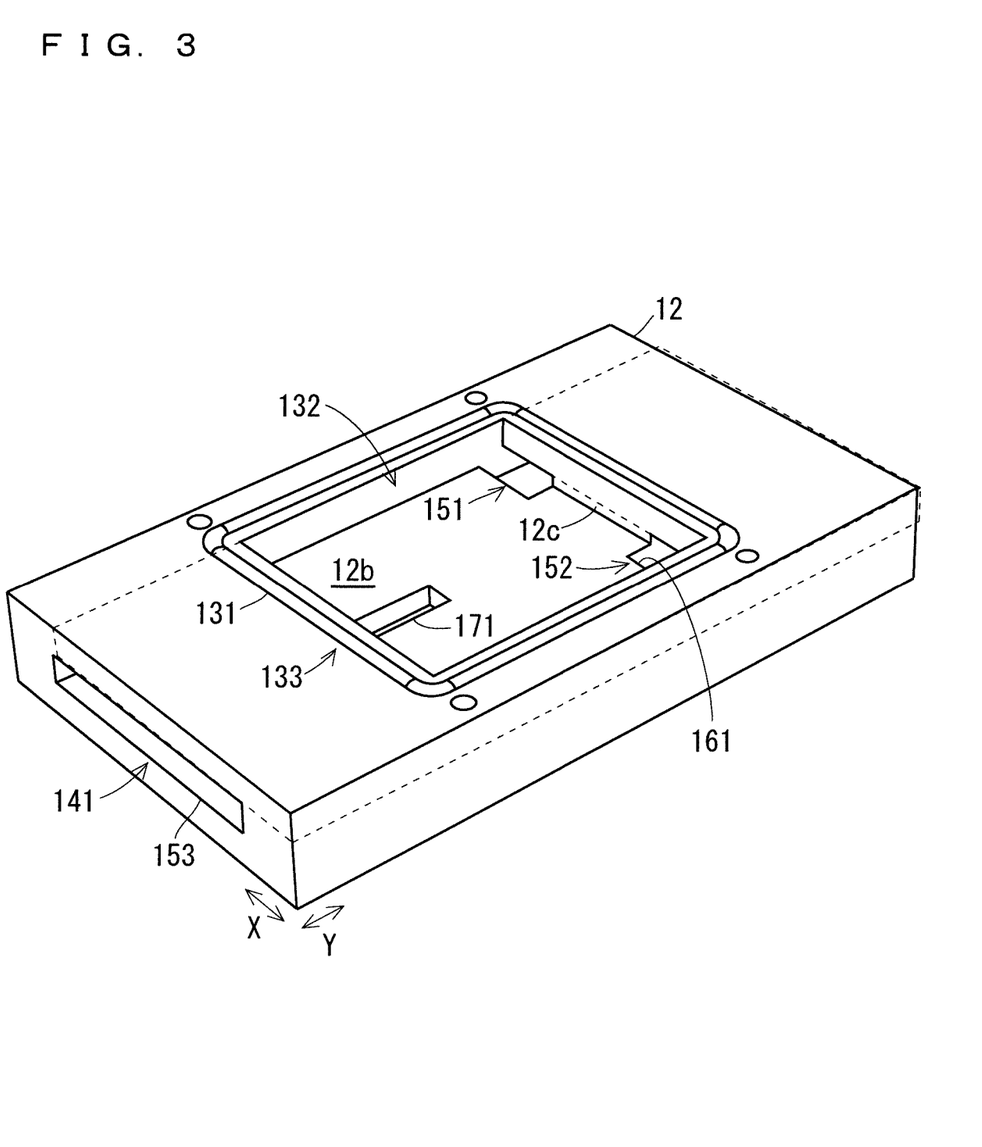
FIG. 3 is a perspective view schematically illustrating a cooling jacket and an O-ring included in the semiconductor device according to Embodiment 1.
Figure 4:
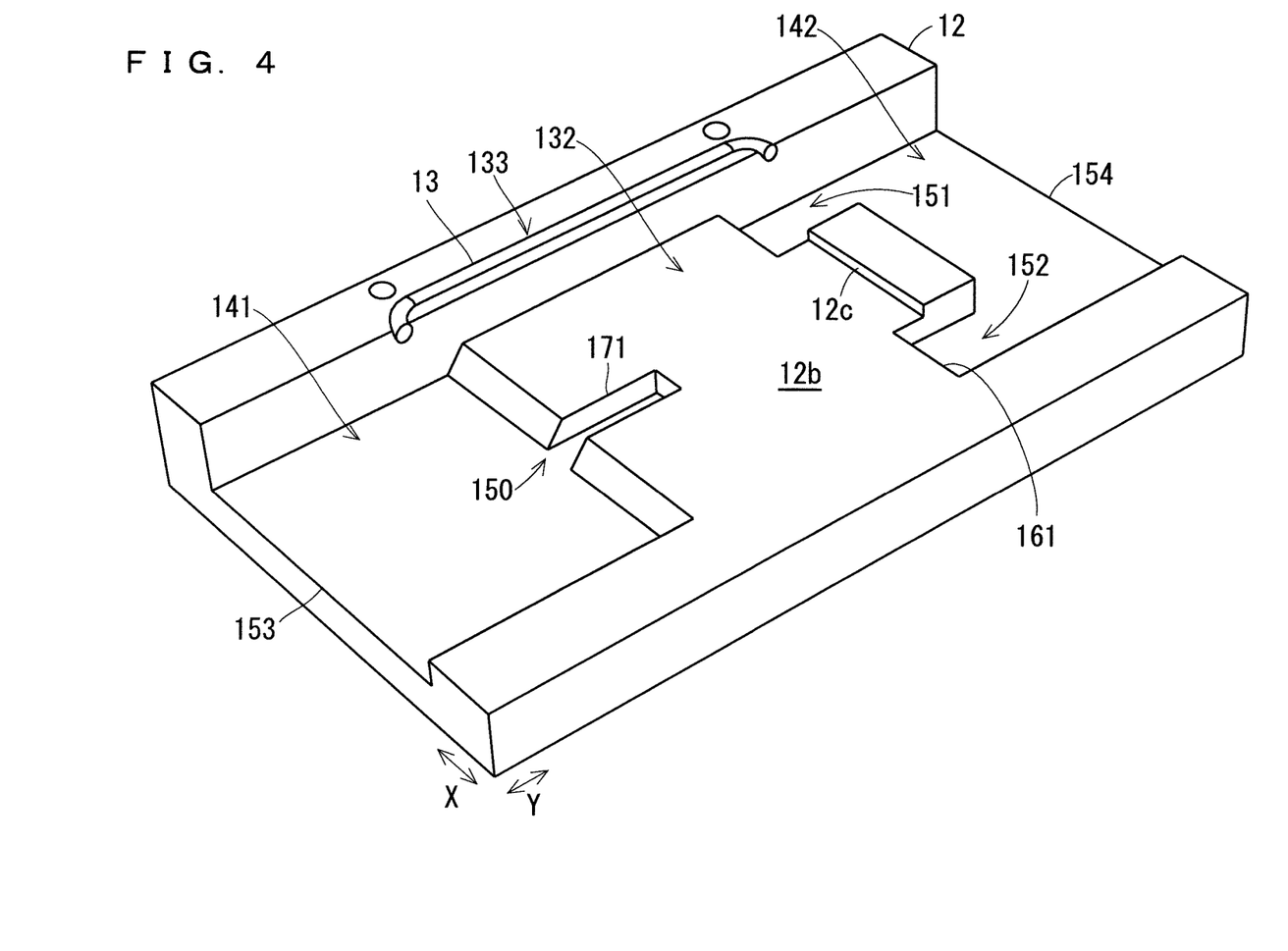
FIG. 4 is a perspective view schematically illustrating parts of the cooling jacket and the O-ring included in the semiconductor device according to Embodiment 1.

FIG. 3 is a perspective view schematically illustrating a cooling jacket and an O-ring included in the semiconductor device according to Embodiment 1. FIG. 4 is a perspective view schematically illustrating parts of the cooling jacket and the O-ring included in the semiconductor device according to Embodiment 1. The parts of the cooling jacket and the O-ring illustrated in FIG. 4 are ones obtained by removing the broken-line portion illustrated in FIG. 3 from the cooling jacket and the O-ring illustrated in FIG. 3.

As illustrated in FIGS. 3 and 4, the cooling jacket 12 has an inflow path 141 and an outflow path 142. The opening 132 has an inlet 150, a first outlet 151, and a second outlet 152. The inflow path 141 has an inflow port 153. The outflow path 142 has an outflow port 154. The inflow port 153 and the outflow port 154 are disposed on a surface of the cooling jacket 12.

The inflow path 141 and the outflow path 142 extend in the second direction Y. The opening 132 has the inlet 150 at an upstream end in the second direction Y. The opening 132 has the first outlet 151 and the second outlet 152 at a downstream end in the second direction Y.

The inflow path 141 extends from the inflow port 153 to the inlet 150. The outflow path 142 extends from the first outlet 151 and the second outlet 152 to the outflow port 154. Accordingly, the refrigerant having flowed into the inflow path 141 through the inflow port 153 flows through the inflow path 141, reaches the inlet 150, and then enters the opening 132 through the inlet 150. The refrigerant that has entered the opening 132 flows through the opening 132, reaches the first outlet 151 and the second outlet 152, and then exits the opening 132 through the first outlet 151 and the second outlet 152. The refrigerant that has exited the opening 132 flows through the outflow path 142, reaches the outflow port 154, and then flows out of the outflow path 142 through the outflow port 154.

A bottom surface 12b of the cooling jacket 12 faces the second main surface 121b of the base plate 121 with the opening 132 interposed therebetween. The bottom surface 12b of the cooling jacket 12 is separated from the second main surface 121b of the base plate 121 in a thickness direction of the base plate 121. The cooling jacket 12 includes a bottom projection 161. The bottom projection 161 has the bottom surface 12b, and raises the bottom surface 12b to a position where tips of the pin fins 122 are disposed.

The cooling jacket 12 has a refrigerant introduction groove 171 on the bottom surface 12b. The refrigerant introduction groove 171 is disposed in the third range R3 in the first direction X. The refrigerant introduction groove 171 extends from an upstream end of the opening 132 in the second direction Y to the middle of an arrangement range R (see FIG. 2) of the plurality of first active elements 102 and the plurality of second active elements 103 in the second direction Y.

The first outlet 151 is disposed in the first range R1 in the first direction X. The second outlet 152 is disposed in the second range R2 in the first direction X. The cooling jacket 12 has a flow dividing wall 12c at a downstream end of the opening 132 in the second direction Y. The flow dividing wall 12c is disposed in the third range R3 in the first direction X. The flow dividing wall 12c closes a portion from the bottom surface 12b of the cooling jacket 12 to the second main surface 121b of the base plate 121. The flow dividing wall 12c is disposed between the first outlet 151 and the second outlet 152 and separates the first outlet 151 and the second outlet 152 from each other.

1.4 Refrigerant Flow

Figure 5:
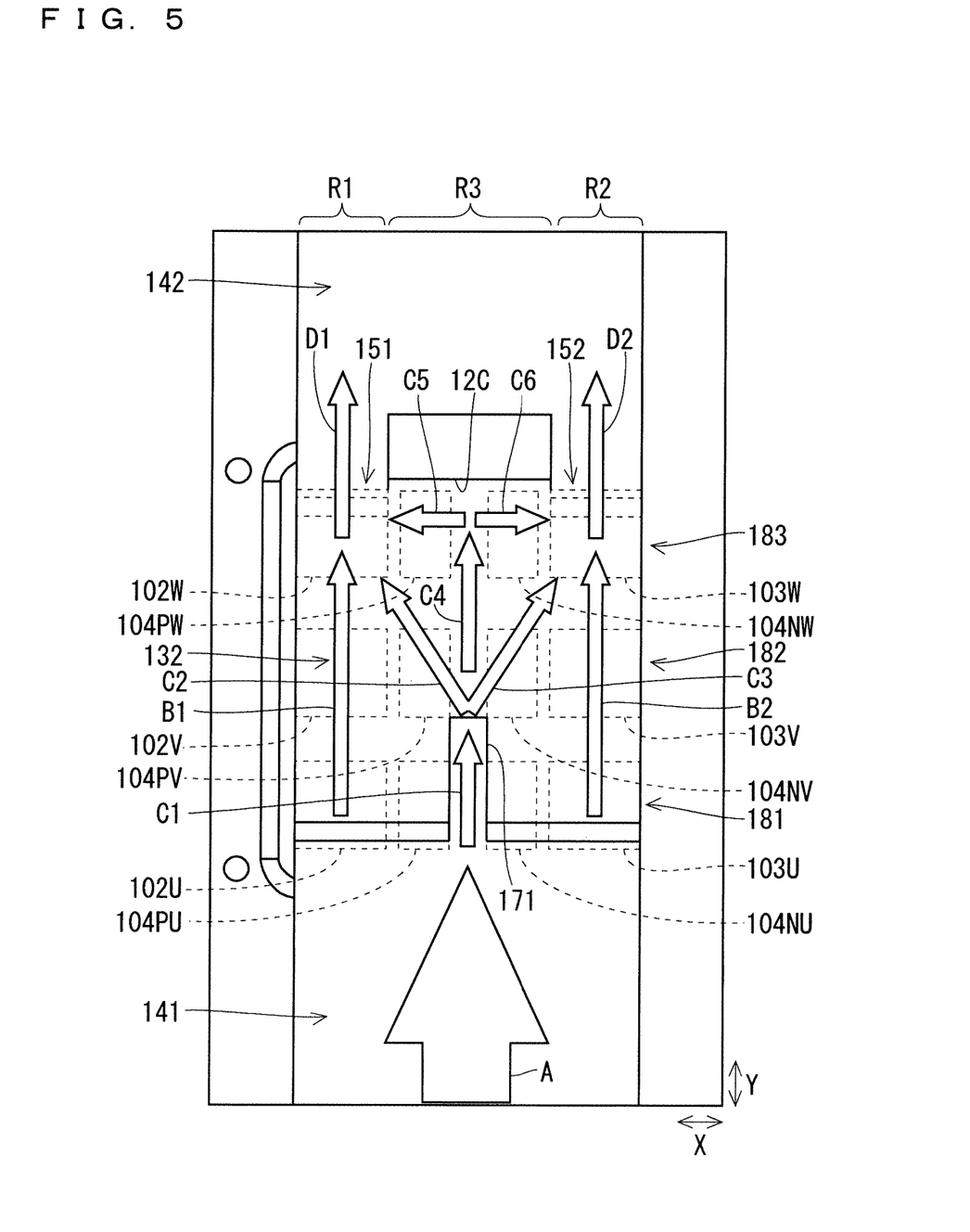
FIG. 5 is a top view schematically illustrating parts of the cooling jacket and the O-ring included in the semiconductor device according to Embodiment 1 and refrigerant flows formed inside the semiconductor device according to Embodiment 1.

FIG. 5 is a top view schematically illustrating parts of the cooling jacket and the O-ring included in the semiconductor device according to Embodiment 1 and refrigerant flows formed inside the semiconductor device according to Embodiment 1.

A low-temperature refrigerant flow A flowing through the inflow path 141 illustrated in FIG. 5 forms refrigerant flows B1 and B2 flowing through an upstream portion 181 and a midstream portion 182 of the opening 132 and forms a refrigerant flow C1 flowing through the refrigerant introduction groove 171. The refrigerant flow B1 is formed in the first range R1 in the first direction X. The refrigerant flow B2 is formed in the second range R2 in the first direction X. The refrigerant flows B1, B2, and C1 proceed from the upstream side in the second direction Y to the downstream side in the second direction Y.

The refrigerant flow C1 forms refrigerant flows C2, C3, and C4 that exit from the refrigerant introduction groove 171 in the midstream portion 182 of the opening 132 and flow through the midstream portion 182 of the opening 132. The refrigerant flows C2, C3, and C4 are formed in the third range R3 in the first direction X. The refrigerant flow C2 moves from the third range R3 in the first direction X to the first range R1 in the first direction X while proceeding from the upstream side in the second direction Y to the downstream side in the second direction Y. The refrigerant flow C3 moves from the third range R3 in the first direction X to the second range R2 in the first direction X while proceeding from the upstream side in the second direction Y to the downstream side in the second direction Y. The refrigerant flow C4 proceeds from the upstream side in the second direction Y to the downstream side in the second direction Y.

The refrigerant flow C4 hits the flow dividing wall 12c and forms refrigerant flows C5 and C6 flowing through the downstream portion 183 of the opening 132. The refrigerant flows C5 and C6 are formed in the third range R3 in the first direction X. The refrigerant flow C5 proceeds from the third range R3 in the first direction X to the first range R1 in the first direction X. The refrigerant flow C6 proceeds from the third range R3 in the first direction X to the second range R2 in the first direction X.

The refrigerant flows B1, C2 and C5 merge to form a refrigerant flow D1 that flows through the downstream portion 183 of the opening 132 and exits the opening 132 through the first outlet 151. The refrigerant flows B2, C3 and C6 merge to form a refrigerant flow D2 that flows through the downstream portion 183 of the opening 132 and exits the opening 132 through the second outlet 152. The refrigerant flow D1 is formed in the first range R1 in the first direction X. The refrigerant flow D2 is formed in the second range R2 in the first direction X. The refrigerant flows D1 and D2 proceed from the upstream side in the second direction Y to the downstream side in the second direction Y.

The refrigerant flow B1 flows under the active elements 102U and 102V. The refrigerant flow B1 takes heat generated by the active elements 102U and 102V and becomes high temperature. The refrigerant flow B2 flows under the active elements 103U and 103V. The refrigerant flow B2 takes heat generated by the active elements 103U and 103V and becomes high temperature.

The refrigerant flow C1 does not flow under the active elements 102U, 102V, 103U, and 103V, but flows under the plurality of passive elements 104 and remains at a low temperature. Accordingly, the refrigerant flows C2, C3, C4, C5, and C6 formed by the refrigerant flow C1 remain at a low temperature.

The refrigerant flow D1 flows under the active element 102W. The refrigerant flow D1 takes heat generated by the active element 102W. The refrigerant flow D2 flows under the active element 103W. The refrigerant flow D2 takes heat generated by the active element 103W.

According to the invention of Embodiment 1, the refrigerant flows D1 and D2 flowing through the downstream portion 183 of the opening 132 in the second direction Y and exiting the opening 132 are formed in the first range R1 and the second range R2 in the first direction X, respectively and are not formed in the third range R3 in the first direction X. Accordingly, flow velocities of the refrigerant flows D1 and D2 for cooling the active elements 102W and 103W, respectively, disposed on the downstream side in the second direction Y become fast. As a result, thermal resistance Rth (j_w) of the active elements 102W and 103W disposed on the downstream side in the second direction Y can be lowered, and the active elements 102W and 103W can be effectively cooled. That is, it is possible to alleviate a rise in temperature of the active elements 102W and 103W. Therefore, the plurality of active elements 102U, 102V, 102W, 103U, 103V, and 103W included in the semiconductor device 1 can be uniformly cooled.

According to the invention of Embodiment 1, the refrigerant flows C2, C3, C5, and C6, which are formed by the refrigerant flow C1 flowing through the refrigerant introduction groove 171 and remain at a low temperature, are merged to form the refrigerant flows D1 and D2 flowing through the downstream portion 183 of the opening 132, cooling the active elements 102W and 103W, and then exiting the opening 132. Accordingly, the temperature of the refrigerant flows D1 and D2 for cooling the active elements 102W and 103W, respectively, disposed on the downstream side in the second direction Y decreases. As a result, the active element 102W and the active element 103W disposed on the downstream side in the second direction Y can be effectively cooled. Therefore, the plurality of active elements 102U, 102V, 102W, 103U, 103V, and 103W included in the semiconductor device 1 can be uniformly cooled.

Therefore, in the semiconductor device 1 according to Embodiment 1, the plurality of active elements 102U, 102V, 102W, 103U, 103V, and 103W included in the semiconductor device 1 can be uniformly cooled by the synergistic effect of the flow dividing wall 12c and the refrigerant introduction groove 171. As a result, it is possible to suppress variations in temperature among the plurality of active elements 102U, 102V, 102W, 103U, 103V, and 103W and thereby improve reliability of the semiconductor device 1.

The refrigerant introduction groove 171 decreases a flow velocity of the refrigerant flow flowing over the refrigerant introduction groove 171. However, since the refrigerant flow flowing over the refrigerant introduction groove 171 flows under the plurality of passive elements 104 that do not generate large heat, the decrease in the flow velocity of the refrigerant flow flowing over the refrigerant introduction groove 171 does not significantly affect cooling of the plurality of active elements 102U, 102V, 102W, 103U, 103V, and 103W.

The number, position, shape, and the like of the refrigerant introduction groove 171 may be changed and the number, position, shape, and the like of the outlets 151 and 152 may be changed according to the number, position, shape, and the like of active elements and passive elements.

Note that the embodiment can be appropriately modified or omitted within the scope of the present invention.

Although the present invention has been described in detail, the above description is illustrative in all aspects, and the present invention is not limited thereto. It is understood that numerous modifications not illustrated can be assumed without departing from the scope of the present invention.

EXPLANATION OF REFERENCE SIGNS

1: semiconductor device
11: semiconductor module
12: cooling jacket
12b: bottom surface
12c: flow dividing wall
101: base plate equipped with pin fins
102: plurality of first active elements
103: plurality of second active elements
104: plurality of passive elements
121: base plate
122: pin fin
121a: first main surface
121b: second main surface
X: first direction
Y: second direction
R1: first range
R2: second range
R3: third range
R: arrangement range
150: inlet
151: first outlet
152: second outlet
171: refrigerant introduction groove

The invention claimed is:
1. A semiconductor device comprising:
a base plate equipped with pin fins including a base plate having a first main surface and a second main surface on a side opposite to a side on which the first main surface is located and pin fins coupled to the second main surface;

a plurality of first active elements disposed on the first main surface, disposed in a first range in a first direction parallel to the first main surface, and aligned in a second direction parallel to the first main surface and perpendicular to the first direction;

a plurality of second active elements disposed on the first main surface, disposed in a second range in the first direction, and aligned in the second direction;

a passive element disposed on the first main surface and disposed in a third range in the first direction between the first range and the second range; and a cooling jacket having an opening accommodating the pin fins and having a first outlet disposed in the first range and a second outlet disposed in the second range at a downstream end in the second direction, the cooling jacket having, at a downstream end of the opening in the second direction, a flow dividing wall disposed in the third range and disposed between the first outlet and the second outlet.

2. A semiconductor device comprising:

a base plate equipped with pin fins including a base plate having a first main surface and a second main surface on a side opposite to a side on which the first main surface is located and pin fins coupled to the second main surface;

a plurality of first active elements disposed on the first main surface, disposed in a first range in a first direction parallel to the first main surface, and aligned in a second direction parallel to the first main surface and perpendicular to the first direction;

a plurality of second active elements disposed on the first main surface, disposed in a second range in the first direction, and aligned in the second direction;

a passive element disposed on the first main surface and disposed in a third range in the first direction between the first range and the second range; and a cooling jacket having an opening accommodating the pin fins and having an inlet at an upstream end in the second direction, the cooling jacket having a bottom surface facing the second main surface with the opening interposed therebetween and having, on the bottom surface, a refrigerant introduction groove disposed in the third range and extending from an upstream end of the opening in the second direction to the middle of an arrangement range of the plurality of first active elements and the plurality of second active elements in the second direction.

3. The semiconductor device according to claim 1, wherein the plurality of first active elements are switching elements on upper arm sides of a U phase, a V phase, and a W phase, the plurality of second active elements are switching elements on lower arm sides of a U phase, a V phase, and a W phase, and the passive element is a free wheel diode on an upper arm side and a lower arm side of a U phase, a V phase, and a W phase.

4. The semiconductor device according to claim 2, wherein the plurality of first active elements are switching elements on upper arm sides of a U phase, a V phase, and a W phase, the plurality of second active elements are switching elements on lower arm sides of a U phase, a V phase, and a W phase, and the passive element is a free wheel diode on an upper arm side and a lower arm side of a U phase, a V phase, and a W phase.

* * * * *